United States Patent [19]

Irie et al.

[11] 3,806,739

[45] Apr. 23, 1974

[54] CONTACTLESS SWITCH

[75] Inventors: Hiroyuki Irie, Osaka; Sadafumi Kitamura, Neyagawa, both of Japan

[73] Assignee: Matsushita Electric Industrial Co., Ltd., Osaka, Japan

[22] Filed: May 31, 1972

[21] Appl. No.: 258,269

[30] Foreign Application Priority Data

| | | |
|---|---|---|
| June 2, 1971 | Japan | 46-46471 |
| June 2, 1971 | Japan | 46-46472 |
| June 10, 1971 | Japan | 46-49295 |
| Sept. 7, 1971 | Japan | 46-81430 |

[52] U.S. Cl.... 307/252 T, 307/252 B, 307/252 UA, 307/117, 397/308, 315/105, 325/392, 325/394

[51] Int. Cl. ...................... H03k 17/68, H03k 17/72

[58] Field of Search ............ 307/240, 247 R, 252 A, 307/252 B, 252 N, 252 Q, 252 T, 252 UA, 284, 271, 305, 308, 311, 116, 117; 323/24, 34; 325/392, 393, 394; 328/1, 5; 315/94, 105

[56] References Cited

UNITED STATES PATENTS

| | | | |
|---|---|---|---|
| 3,656,005 | 4/1972 | Lee | 307/252 B X |
| 3,457,430 | 7/1969 | Samuelson | 307/252 B |
| 3,255,380 | 6/1966 | Atkins et al. | 328/5 X |
| 3,221,183 | 11/1965 | White | 307/252 T |
| 3,440,347 | 4/1969 | Spencer et al. | 325/392 X |
| 3,663,950 | 5/1972 | Bartlett | 307/252 T X |
| 3,555,292 | 1/1971 | Henry | 307/252 B X |
| 3,243,711 | 3/1966 | King et al. | 307/252 T X |
| 3,684,898 | 8/1972 | Wood | 307/252 N |
| 3,453,599 | 7/1969 | Lester | 307/252 B X |
| 3,266,021 | 8/1966 | Druz et al. | 307/252 N |
| 3,098,212 | 7/1963 | Creamer, Jr. | 325/393 X |
| 3,183,444 | 5/1965 | Roschke | 325/392 |
| 3,218,558 | 11/1965 | Kieffer | 325/392 |
| 3,467,834 | 9/1969 | Coleman | 307/116 |
| 3,527,957 | 9/1970 | Eck | 307/252 B X |
| 3,539,819 | 11/1970 | Parisoe | 325/393 X |
| 3,568,005 | 3/1971 | Atkins | 307/116 X |
| 3,617,773 | 11/1971 | Eccles | 307/252 C |
| 3,666,988 | 5/1972 | Bellis | 307/252 B X |

OTHER PUBLICATIONS

Duelm, "Remote Control of a Triac is Made Easy by Using One IC," Electronic Design, 9-27-1970, p. 69.

"Optical Link Isolates Low-Cost Solid-State Relay," EDN-EE, 5-15-1971, p. 69.

*Primary Examiner*—Rudolph V. Rolinec

*Assistant Examiner*—L. N. Anagnos

*Attorney, Agent, or Firm*—Stevens, Davis, Miller & Mosher

[57] ABSTRACT

A contactless switching device comprising a bistable circuit, insulating means and thyristors, which device is used to connect an electric apparatus with a power supply and to disconnect the apparatus from the supply by means of a switch provided in the electric apparatus or in a remote-control unit, and which device has an improved reliability, is small in size and produces no acoustic noise during operation.

5 Claims, 12 Drawing Figures

CONTACTLESS SWITCH

The present invention relates to a contactless switch, and more particularly to a contactless switch using a bistable circuit, insulating means and thyristors.

For a better understanding of the present invention and for comparing it with the prior art ones, reference may be made to the accompanying drawings wherein the same reference numerals have been applied to like parts and wherein.

Figure 1:
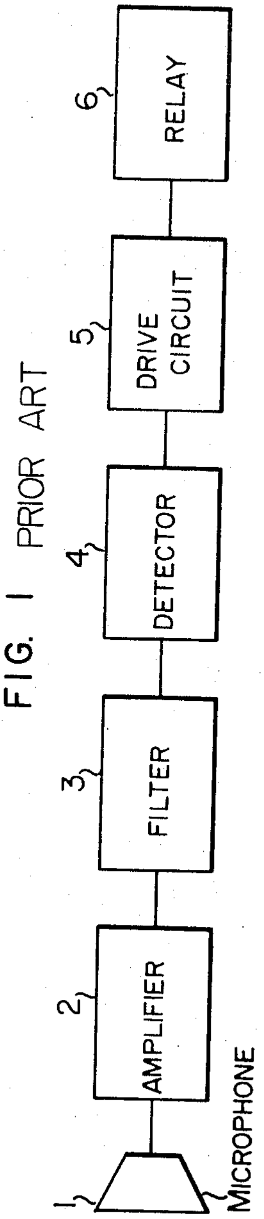
FIG. 1 PRIOR ART
FIG. 1 is a block diagram of a conventional remote control device.

The conventional way of controlling an a.c. power supply by means of a remote control device, applied to, for example, a television receiver has had resort to such a constitution as shown in FIG. 1, wherein a supersonic wave signal from a remote control transmitter is received by a microphone 1 and sent through an amplifier 2 and a filter 3 to a detector 4 to produce a detected output which actuates a relay drive circuit 5 to energize an a.c. power control relay 6 connected in the power circuit of the television receiver. With this constitution, however, the relay produces acoustic noise during its operation and there are some drawbacks from the standpoint of useful life and dimensions.

The present invention has been made to eliminate such drawbacks as mentioned above.

One object of the present invention is to provide a contactless switch for use in the power circuit of an electric machine or apparatus, which is very conveniently applied to a remote control device and the like.

Another object of the present invention is to provide a contactless switch especially used for an a.c. power circuit and therefore applicable to general electric machinery.

An additional object of the present invention is to make possible the pre-heating operation of an electric machine or apparatus using electron tubes.

Figure 2:
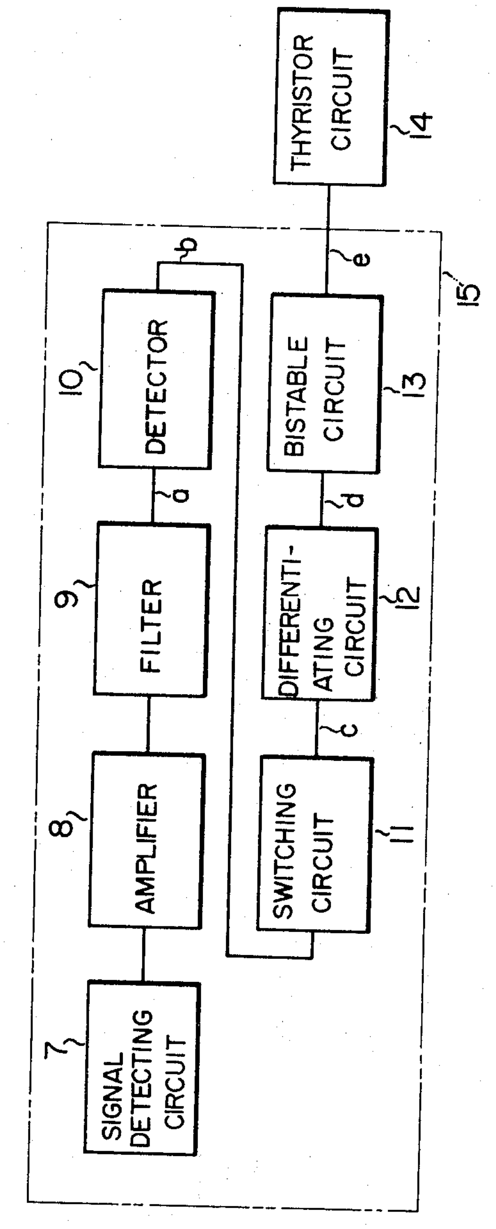
FIG. 2 is a block diagram of a remote control device using a contactless switch, embodying the present invention.
Figure 3:
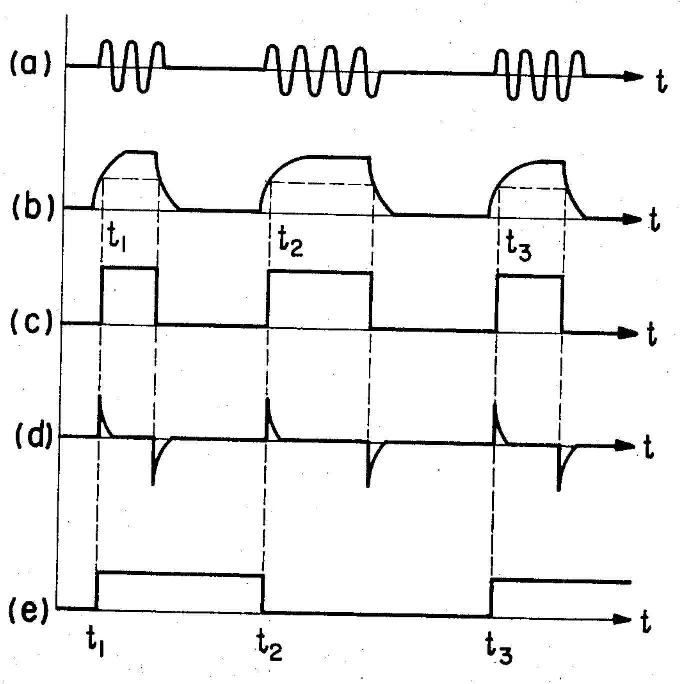
FIG. 3 shows the waveforms of signals appearing at several points in the circuit of the device shown in FIG. 2.

The present invention will be described below through the embodiments thereof. FIG. 2 shows a remote control device as an embodiment of the invention. A control signal detecting circuit 7 receives either a control signal from a remote control transmitter or a signal from a control switch provided in the device itself. An amplifier 8 amplifies the output from the detecting circuit 7. A filter 9 serves to pass only a predetermined signal. A detector 10 recives the signal sent from the filter 9 and delivers an output which is fed through a switching circuit 11 to a differentiating circuit 12. The differentiated output from the circuit 12 actuates a bistable circuit 13, the output of which is applied to the gate of a thyristor provided in a thyristor circuit 14 so that the power source is connected or disconnected. The switching circuit 11 is so designed as not to operate in response to an input having a level below a certain threshold, thus being free from erroneous operation caused by spurious information such as external interference signals. The switching circuit 11 also serves to shape waveforms. The bistable circuit 13 is a certain circuit, for example, a bistable multivibrator circuit which can continuously deliver a d.c. or a.c. output having 0 or 1 level during the time from reception of a certain signal till reception of the next arriving signal. FIG. 3 shows various waveforms appearing in the circuit shown in FIG. 2. The waveform (a) is the output of the filter 9 where the signal received by the detecting circuit 7 from a control signal source is supersonic. The waveform (b) is obtained by detecting the waveform (a). The waveform (c) is derived by passing the waveform (b) through the switching circuit 11. The waveform (d) is the result of differentiation of the waveform (c). The waveform (e) is obtained by driving the bistable multivibrator with the output of the differentiator 12. The thyristor (in the circuit 14) with an a.c. voltage applied between its anode and cathode is turned on during the time $t_1 - t_2$ since a d.c. voltage from the multivibrator 13 is applied between its gate and cathode during that time. During the time $t_2 - t_3$, however, the thyristor is turned off at the beginning of the coming negative cycle of the a.c. voltage applied between its anode and cathode since there is no voltage applied between the gate and cathode of the thyristor during that time. If the next positive cycle of the a.c. anode-cathode voltage is reached, the thyristor cannot be turned on without the gate-cathode signal. Thus, the a.c. power can be turned on or off. In the device shown in FIG. 2, a gate pulse for the thyristor circuit 14 is fed by the bistable circuit 13 so that the thyristor circuit 14 remains conductive after the first signal received by the detecting circuit 7 has had influence on the multivibrator circuit 13 and continues to be in the conductive state till the next signal is received. Thus, the device can provide a optimum operation for remote control or soft touch switching described later.

In the above described case, the earth circuit of the thyristor circuit 14 and that of the bistable circuit 13 must be insulated from each other in respect of direct current since it is necessary to apply the output of the bistable circuit 13 between the gate and cathode of the thyristor of the circuit 14. Therefore, the block 15 including blocks 7 to 13 must be insulated from the thyristor circuit 14 in respect of direct current, or alternatively some insulating means must be provided for the block 15.

Figure 4:
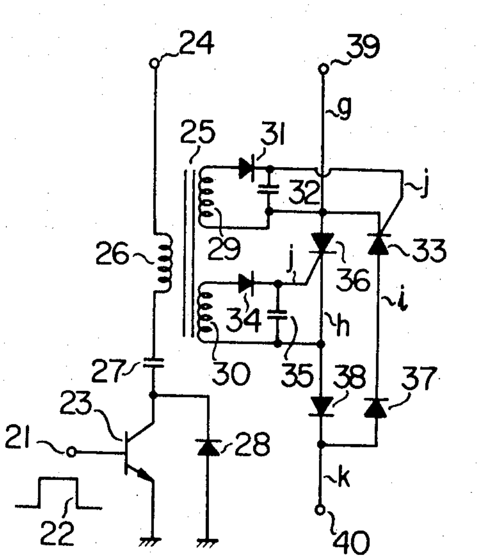
FIG. 4 shows the electric wiring of a thyristor circuit.

An embodiment of the present invention wherein such insulating means are provided in the thyristor circuit 14, will now be described. FIG. 4 shows in detail the electrical connection of the thyristor circuit 14. A rectangular wave signal 22 from the bistable circuit 13 is applied to a terminal 21. The rectangular wave signal 22 performs the switching control of a transistor 23. A high frequency signal or the a.c. commercial supply is applied to a terminal 24 which is connected through the primary winding 26 of a transformer 25 and a capacitor 27 with collector of the transistor 23. The capacitor 27 and a diode 28 in combination serves to shift the d.c. level of the voltage at the collector of the transistor 23 toward the positive direction since only poor efficiency can be attained if only a half cycle of the a.c. component of the voltage is utilized during the operation of the transistor 23. Therefore, the transistor 23 is turned on when its base is maintained at a high potential and a.c. outputs can be developed across the secondary windings 29 and 30 of the transformer. And when the base is at a low level, no output is obtained from the secondary windings 29 and 30.

An a.c. output derived from the secondary winding 29 is rectified by a diode 31 and flattened by a capacitor 32 so as to be applied to the gate of a thyristor 33 as a gating signal. In like manner, an a.c. signal induced in the secondary winding 30 is converted through a diode 34 and a capacitor 35 to a gating signal for a thyristor 36. Diodes 37 and 38 connected in series between the thyristor 33 and 36 serve to cause the half wave outputs of the thyristors to start from zero level. A terminal 39 is connected with the commercial a.c. supply line while a terminal 40 is coupled to an electric machine, to be fed.

Figure 5:
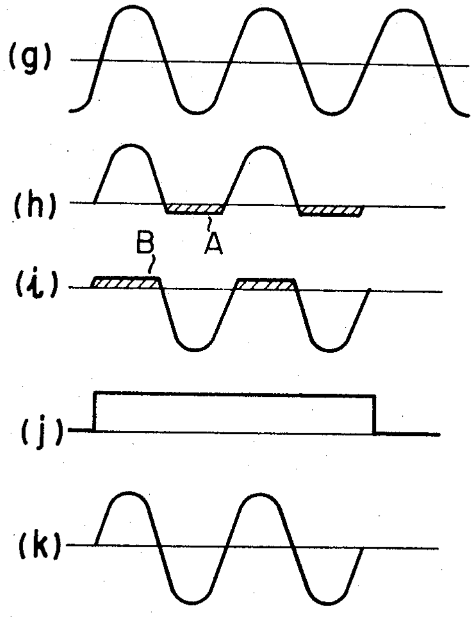
FIG. 5 shows the waveforms of signals appearing at several points in the circuit shown in FIG. 4.

FIG. 5 shows waveforms appearing at several points in the circuit of FIG. 4. The waveform (g) is the a.c. input applied to the terminal 39; (h) the output of the thyristor 36; (i) the output of the thyristor 33; (j) gating signal for the thyristor 33 or 36; and (k) a signal appearing at the terminal 40 and continuing to exist only while the gating signal (j) exists. As seen in the waveforms (h) and (i), there remains in the outputs from the thyristors 36 and 33 respectively small negative and positive voltages even while they are cut off, as indicated by arrows A and B. Without the diode 37 and 38, therefore, the small negative and positive voltage would cause current through the thyristors so that the power loss of the thyristors would be increased. As it is, the diodes 37 and 38 block the reverse current due to the voltages A and B, thus the power loss of the thyristors 33 and 36 is prevented from increasing.

Figure 6:
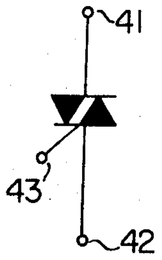
FIG. 6 is a symbolic representation of a triac.

FIG. 6 shows a bidirectional thyristor which can be used in substitution for the two thyristors 33 and 36. For this purpose, it is only necessary that the terminals 41, 42 and 43 should be connected respectively with the a.c. power source, an electric machine and one terminal of the secondary winding 29 at which the gating signal (j) appears. The bidirectional thyristor, i.e. triac, is a single element and has bidirectionally symmetric blocking and conducting characteristics. This triac can fire in both directions in response to a small gate signal. Namely, the triac can be controlled by a gate signal of either a positive or negative d.c. voltage or a high frequency voltage. Therefore, the range of utility of this device can be extended.

Figures 7, 9:
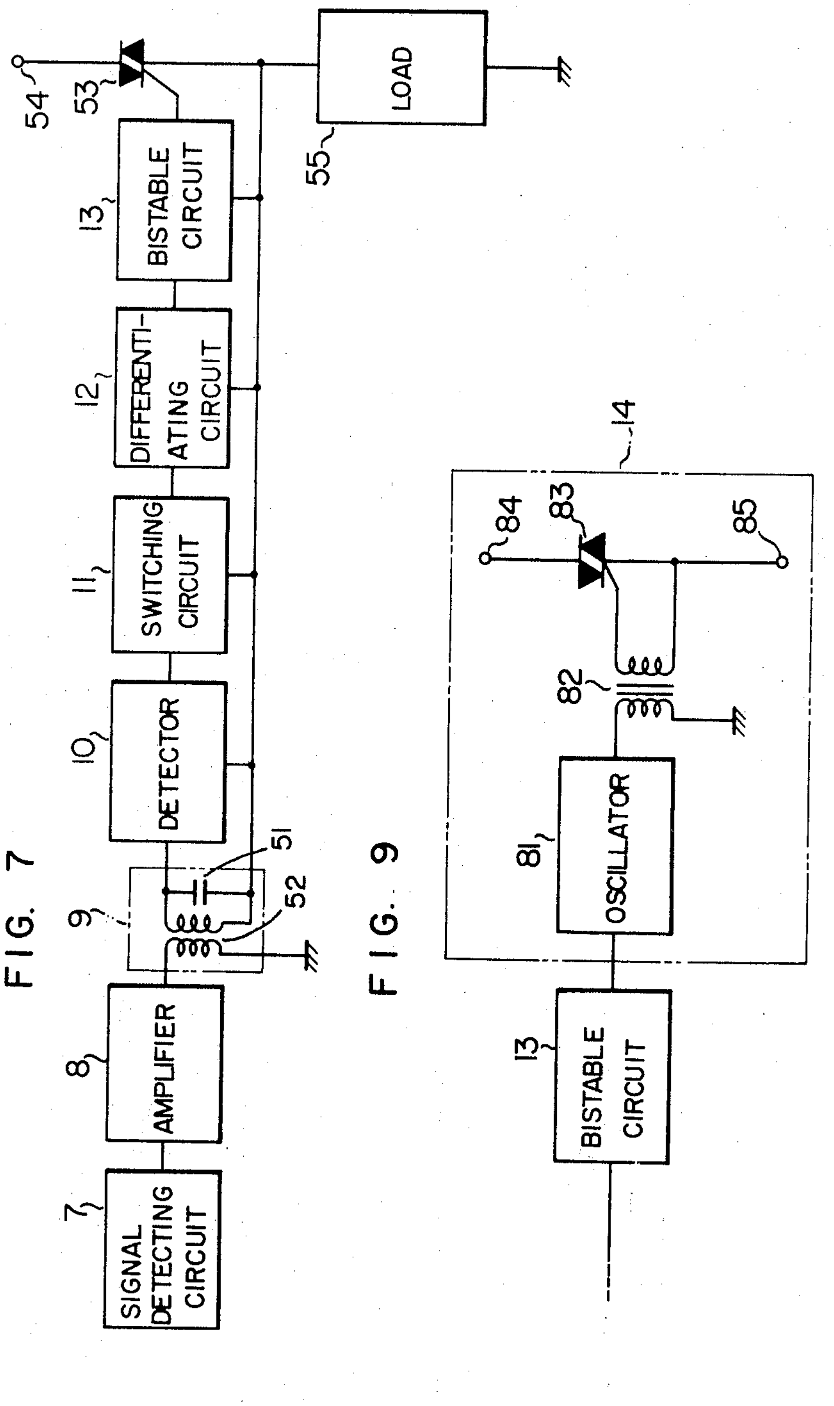

FIG. 7 shows another embodiment of the present invention wherein an insulating means is provided in the filter 9. Namely, a tuning transformer is used for frequency selection and only a tuned frequency is derived. Numerals 51 and 52 indicate a tuning capacitor and a tuning transformer, respectively. A triac 53 has a terminal 54 at which an a.c. power source to be controlled is connected. Numeral 55 designates a load circuit such as an electric machine. The earth terminal of the primary winding of the transformer 52 of the filter 9 is not connected with the earth terminal of the secondary winding of the transformer 52. The earth terminal of the secondary winding of the transformer 52 is connected in common with those of the blocks 10 to 13, i.e., from detector to bistable circuit, and the common connection is in turn connected with the cathode of the triac 53. With this constitution, the transformer 52 of the filter 9 has only to be of the insulated type and no additional circuit for insulation is needed. Thus, the overall device can be fabricated with ease and at low expense.

Figure 8:
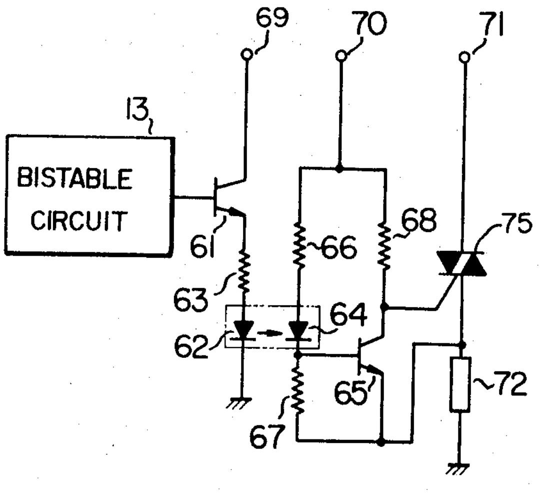
FIGS. 7 to 9 show further embodiments of the present invention.

FIG. 8 shows a thyristor circuit embodying the present invention wherein a photocoupler is used for insulation purposes. The photocoupler consists of an electroluminescent diode 62 and a photocell, i.e., photosensitive diode 64. The photocoupler is, therefore, optically coupled but isolated in respect of direct current between the luminescent diode and the photocell. Moreover, the photocoupler can transmit a d.c. signal as well as an a.c. signal by means of light. A bistable circuit 13 delivers an output which operates an emitter-follower transistor 61 so that current is drawn through the electroluminescent diode 62. A resistor 63 serves as a current limiter. If the diode 62 luminesces due to the current drawn therethrough, the photocell 64 receives light so that the internal resistance of the photocell 64 is rendered low. Accordingly, the potential at the base of a transistor 64 rises and the transistor 65 is turned on. Therefore, a short-circuit is established between the gate and cathode of a triac 75 and the triac 75 is turned off. In like manner, if there is no output delivered from the bistable circuit 13, the transistor 65 is turned off and the triac 75 is turned on. Numerals 66 and 67 designate bias resistors. A bias resistor 68 serves to limit current between the gate and cathode of the triac 75. Terminals 69 and 70 are connected with a different d.c. power source while a terminal 71 is connected with the commercial supply line. An electric machine 72 is connected between the cathode of the triac 75 and the earth. In this thyristor circuit shown in FIG. 8, the earth circuit before the luminescent diode 62 has only to be separated from that after the photocell 64. The device shown in FIG. 8, with a photocoupler, may have a smaller size than that shown in FIG. 4 with a transformer.

Another embodiment of the invention can be proposed by coupling all the earth circuits of the block 15 in FIG. 2 to the cathode of the thyristor of the circuit 14.

FIG. 9 shows another embodiment of the present invention, wherein the oscillation of the oscillator circuit 81 is controlled by the output of the bistable circuit 13 and the oscillation is started if the output is applied while the oscillation stops if the output ceases. The output of the oscillator circuit 81 triggers a triac 83 through a transformer 82. The triac 83 can be triggered by an a.c. signal, as described above, and the use thereof can simplify the circuit constitution. If the oscillation frequency is set at a high level, the transformer to be incorporated may be small in size. Further, since there is no need for a power source in the stage of the circuit after the insulation transformer 82, which is necessary for the other embodiment described above, no circuit for power source separation is needed. Numerals 84 and 85 indicate a terminal to which the commercial a.c. supply line is coupled and a terminal with which an electric machine is connected.

For the control signal detecting circuit as shown in FIG. 2, a microphone or a photodiode may be used accordingly as the control signal is transmitted in supersonic wave or remote control is performed by means of light.

In case where a photodiode is used, it is preferable to design the thyristor circuit 14 in such a manner that when the photodiode receives light the bias circuit of the transistor may operate to drive the transistor into oscillation or to change the oscillation frequency of the transistor. By doing this, the thyristor circuit 14 can be driven by applying the oscillation frequency to the amplifier 8, just as in case where a supersonic signal is used.

According to the present invention, besides the remote control transmitter as mentioned above, a switch provided in the remote control receiver can also generate a control signal which operates a bistable circuit to control a power switch. An example is described below wherein a touch switch is used.

Figure 10:
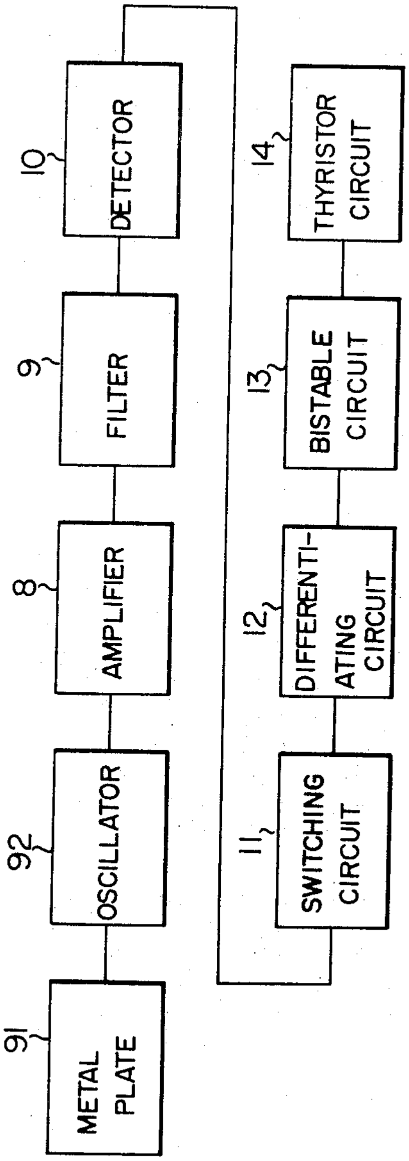
FIG. 10 is a block diagram of a soft touch switch utilizing the present invention.

The term "touch switch" is not applied to any mechanically operated switch but to a construction in which a circuit is switched on or off by merely touching by hand a certain portion of the circuit. FIG. 10 shows such a construction. In FIG. 10, numeral 91 designates a metal plate, 92 an oscillator circuit, and numerals 8 to 14, of course, designate the same components as in FIG. 2. By touching the metal plate 91 by hands, the capacitance of a capacitor in the oscillator circuit 92 is varied and therefore the oscillation frequency is changed. This change in the oscillation frequency is detected by the filter 9 and the detector 10 and can control the thyristor circuit 14 in the same manner as described above.

As described above, according to the present invention, the contactless operation of an electric machine can be realized by controlling a thyristor having a gate terminal such as a SCR or a triac, connected in the power circuit through the operation of a bistable circuit either by an output derived as a result of reception of supersonic waves or light or by a signal generated by a touch switch. Accordingly, the life of the machine is prolonged, the size of the machine is reduced and there is no acoustic noise as due to the operation of a mechanical switch. Moreover, since the thyristor is controlled by the output of a bistable multivibrator, once the multivibrator is triggered the assumed condition will continue to exist until the next trigger signal is applied to the multivibrator. And this is very useful where an electric apparatus is remote controlled.

Figure 11:
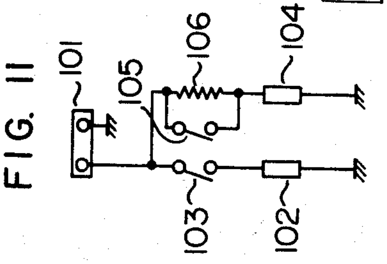
FIG. 11 is a circuit diagram of a conventional preheating circuit.
Figure 12:
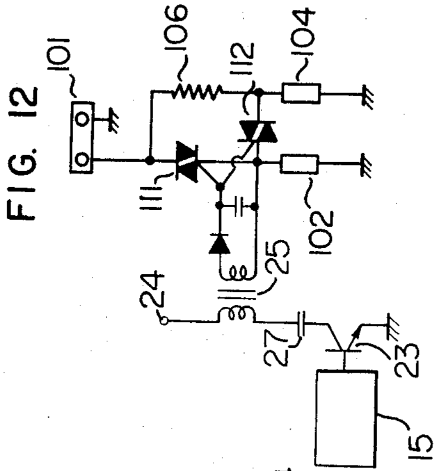
FIG. 12 is a circuit diagram of a preheating circuit utilizing the present invention.

Now, an example will be described wherein the present invention is applied to a preheating circuit used, for example, in a TV receiver to shorten the time required for pictures to appear on the picture tube after actuation of the power switch. FIG. 11 shows a conventional circuit and FIG. 12 shows a circuit according to the present invention. In FIG. 11, a first power switch 103 is inserted between an a.c. power terminal 101 and a main circuit 102, and a parallel circuit of a second power switch 105 and a resistor 106 is inserted between a terminal 101 and a heater circuit 104 for electron tubes. The power switches 103 and 105 are jointly operated and the value of the resistance of the resistor 106 is so selected that about 60 percent of the rated voltage may be applied to the heater circuit 104 from the terminal 101 when the power switches are opened. Accordingly, due to the preheating effect the heater filaments of the electron tubes will soon saturate thermally in a short time after the closure of the switches 103 and 105 so that the main circuit 102 will soon assume its stable state. With such a device as shown in FIG. 11, however, faults will often occur due to the use of mechanical switches. For example, if the switch 105 is damaged, pictures will not appear on the picture tube. In FIG. 12, numerals 111 and 112 designate three-terminal bidirectional thyristors, and 15 the block similar to that shown in FIG. 2. The thyristors 111 and 112 correspond to the switches 103 and 105. Now, if there is no output from the bistable circuit 13, the thyristors 111 and 112 remain cut off, and only the heater circuit 104 is supplied with electric energy through the resistor 106. If, on the other hand, the bistable circuit delivers its output, the thyristors 111 and 112 are turned on, and the rated voltage is applied to both the main circuit 102 and the heater circuit 104 so that the TV receiver sets in its stable state in a short time. Thus, with the constitution as shown in FIG. 12, a preheating circuit can easily be accomplished by merely adding a bidirectional thyristor to the constitution of the contactless power circuit as described above. A thyristor having a small capacity can be used as the thyristor for the heater circuit since the rush current is negligible due to the preheating effect.

Further, even if there is caused a fault in the resistor to limit the preheating current, the power voltage is never applied directly across the thyristor so that the withstand voltage of the thyristor can be small. This will favorably affect the cost of the resultant product.

What we claim is:

1. A contactless switch for switching an electrical load into and out of an AC power source circuit, comprising:

an operating means for generating a control signal when switching is desired;

a bistable circuit which is triggered between two stable states by said control signal;

a switching element which is switched in response to the output of said bistable circuit;

a transformer having a primary and a secondary winding;

a series circuit of said switching element, a capacitor and said primary winding connected directly across said AC power source;

thyristor means connected between the AC power source and a load; and a circuit for applying the output of the secondary winding of said transformer to the gate electrode of said thyristor means thereby to turn on said thyristor means.

2. A contactless switch according to claim 1, wherein said load comprises an electron tube having a heater circuit and a current limiting resistor connected between said AC source and said heater circuit for preheating said heater; and said thyristor means comprises a first thyristor connected between said AC source and said load, and a second thyristor connected between the connecting point of said heater and said current limiting resistor and the connecting point of said first thyristor and said load, said first and second thyristors being connected in common with the secondary winding of said transformer.

3. A contactless switch according to claim 2, wherein the gate terminals of said first and second thyristors are connected in common with said secondary winding.

4. A contactless switch according to claim 1, wherein a diode is connected in series with said thyristor.

5. A contactless switch according to claim 1, wherein said transformer is provided with two secondary windings which are respectively connected with signal extracting circuits so that signals of positive polarity may be extracted in both said signal extracting circuits respectively from the positive and negative half cycles of said commercial AC source and said thyristor means comprises two thyristors oppositely connected in parallel with each other and connected between said commercial AC source and said load, the outputs of said signal extracting circuits being applied to the respective gates of said thyristors.

* * * * *